(12) United States Patent
Hayami

(10) Patent No.: US 6,477,125 B1
(45) Date of Patent: Nov. 5, 2002

(54) DECODING APPARATUS

(75) Inventor: Atsushi Hayami, Yokohama (JP)

(73) Assignee: Victor Company of Japan, Ltd., Yokohama (JP)

( * ) Notice: Subject to any disclaimer, the term of this patent is extended or adjusted under 35 U.S.C. 154(b) by 0 days.

(21) Appl. No.: 09/438,297

(22) Filed: Nov. 12, 1999

(30) Foreign Application Priority Data

Dec. 4, 1998 (JP) .......................................... 10-361899
Jun. 2, 1999 (JP) .......................................... 11-155673

(51) Int. Cl.$^7$ ................................................ G11B 7/00
(52) U.S. Cl. ................................ 369/59.22; 369/47.35
(58) Field of Search ........................... 369/59.22, 47.35

(56) References Cited

U.S. PATENT DOCUMENTS

| | | | |
|---|---|---|---|
| 5,566,155 A | * 10/1996 | Hayashi | 369/59.22 |
| 5,680,380 A | * 10/1997 | Taguchi et al. | 369/59.22 |
| 5,684,773 A | * 11/1997 | Hayashi | 369/59.22 |
| 5,781,590 A | 7/1998 | Honma et al. | |
| 5,995,465 A | * 11/1999 | Hayashi et al. | 369/59.22 |
| 6,335,913 B1 | * 1/2002 | Okamoto | 369/59.22 |

FOREIGN PATENT DOCUMENTS

| | | |
|---|---|---|
| EP | 0 652 559 A | 5/1995 |
| EP | 0 751 653 A | 1/1997 |
| JP | 6-150549 | 5/1994 |
| JP | 7-93914 | 4/1995 |
| JP | 10-208395 | 7/1998 |

OTHER PUBLICATIONS

"Development of Viterbi Decoder for DVD" by Hayashi et al; Pioneer R&D vol. 6, No. 2; pp., 37–43.

* cited by examiner

*Primary Examiner*—Aristotelis M. Psitos
(74) *Attorney, Agent, or Firm*—Louis Woo

(57) ABSTRACT

An waveform equalizer equalizes the signal reproduced from an optical disc to remove reproduction waveform distortion with a frequency characteristic controlled. A binary coder and a PLL circuit generate a bit clock. An a/d converter a/d-converts the equalized signal in response to the bit clock. A Viterbi decoder including metric operation decodes the output of the a/d converter in response to the bit clock to output a bit stream. The metric operation generates a metric operation result from an output of the a/d-converter and prediction data. The Viterbi decoder Viterbi-decodes the output of the a/d converter through the metric operation according to prediction data. An operating circuit operates an equalizing error from the output of a/d converter and a waveform equalizing target. A coefficient generator controls the frequency characteristic according to the equalizing error to minimize the equalizing error. The prediction data for the metric operation is operated from the output of the a/d converter for better decoding. Instead the binary coder, data estimation and generating the bit clock signal is provided with a data estimation and PLL circuit. The bit clock signal is supplied to the Viterbi decoder and the estimated data is supplied to the Viterbi decoder and the operation circuit.

2 Claims, 12 Drawing Sheets

FIG. 4
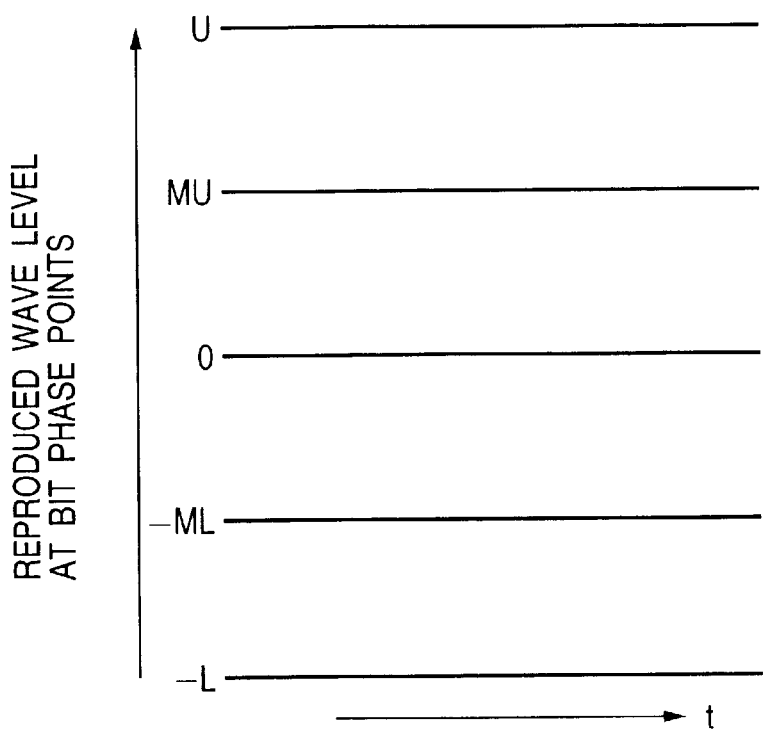
FIG. 5A
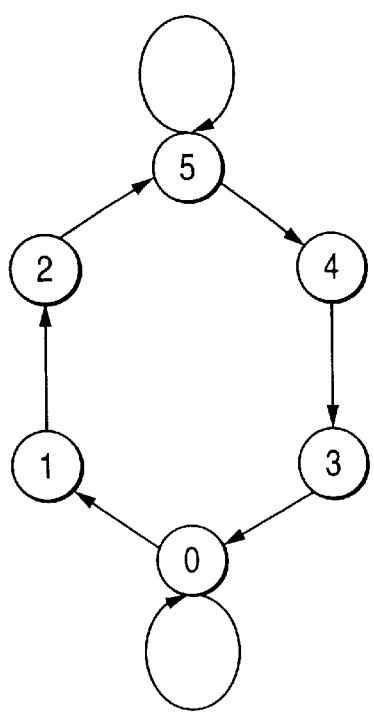
FIG. 5B
| COND | DATA VAL |
|------|----------|
| 5 | 111 |
| 4 | 110 |
| 3 | 100 |
| 2 | 011 |
| 1 | 001 |
| 0 | 000 | ns
DECODING APPARATUS

BACKGROUND OF THE INVENTION

1. Field of the Invention

This invention relates to a decoding apparatus, particularly to a decoding apparatus for decoding a signal reproduced from an optical disc.

2. Description of the Prior Art

A decoding apparatus for decoding a signal reproduced from an optical disc is known.

FIG. 11 is a block diagram of a prior art decoding apparatus for decoding a signal reproduced from an optical disc. In FIG. 11, an RF (radio wave frequency) signal reproduced from an optical disc is supplied a gain-controlled amplifier 11. The gain-controlled amplifier 11 amplifies the RF signal with its envelope level kept constant in accordance with a gain control signal. An output of the gain-controlled amplifier 11 is supplied to a waveform equalizing circuit 12. The waveform equalizing circuit 12 removes a waveform distortion caused by lack of transmission bandwidth, that is, waveform-shapes the output of the gain-controlled amplifier 11. A level detection and controlling circuit 13 compares an envelope level of an output of the waveform equalizing circuit 12 with a target value and generates a gain control signal to make the envelop level equal to the target value to control the gain of the gain controlled amplifier 11.

An output of the waveform equalizing circuit 12 is supplied to one input of an adder 14. A binary coding circuit 15 binary-codes the output of the adder 14 such that the output of the adder 14 compared with a center level to output a reproduced code stream. The reproduced code stream is also supplied to a PLL (Phase Locked Loop) circuit 17 and to an automatic slicer 16.

The automatic slicer 16 generates a level adjusting signal from the reproduced code stream and supplies it to another input of the adder 14 to adjust the center level of the output of adder to prevent binary-coding error caused by asymmetric waveforms which may be generated in accordance with a molding condition of the optical disc. The PLL circuit 17 generates a bit synchronizing clock from the reproduced code stream.

In this prior art decoding apparatus, the binary coding circuit only binary-codes the output of the adder 14 by comparing the output of the adder 14 with a center line level adjusted, so that if skew occurs in a relative angle between the optical pickup generating the RF signal and the optical disc, there is a tendency that the S/N ratio becomes insufficient.

Moreover, another prior art decoding apparatus including Viterbi decoder is known. FIG. 12 is a block diagram of such a prior art Viterbi decoder described in "PIONEER R&D" (Vol. 6. No. 2). In FIG. 12, a reproduced signal from an optical head is supplied to an a/d converter 101. An output of the a/d converter 101 supplied to a Viterbi decoder. The Viterbi decoder includes a branch metric operation circuit 102 for effecting a branch metric operation with the output of the a/d converter 101 and first to third prediction values to output a square error between the reproduced sample value and the first to third prediction values, a path metric operation circuit 103 for effecting a path metric operation, and a path memory 104 for storing an output of the path metric operation circuit 103.

The output of the Viterbi decoder is supplied to an eight/sixteen demodulator 105.

The a/d converter 101 a/d-converts the reproduced signal and limits peak values. The Viterbi decoder effects Viterbi decoding processing including the metric operation with only three fixed values of prediction data, that is high, zero, and low values to output a reproduced code stream.

In this prior art decoding apparatus, there is a problem in that the metric characteristic which the reproduced signal inherently has is insufficiently used.

SUMMARY OF THE INVENTION

The aim of the present invention is to provide an improved decoding apparatus.

According to the present invention, a first decoding apparatus for decoding a signal reproduced from an optical disc is provided which includes: a gain control circuit for controlling an envelope level of a waveform of the signal to a predetermined level; an waveform equalizing circuit having a frequency characteristic for waveform-equalizing the signal from the gain control circuit to remove reproduction waveform distortion of the signal, the frequency characteristic being changed in accordance with at least a tap coefficient; a binary coding circuit for binary-coding an output of the waveform equalizing circuit; a phase-locked-loop circuit for generating a bit synchronizing clock signal on the basis of an output of the binary coding circuit; an a/d converting circuit for a/d-converting an output of the waveform equalizing circuit in response to the bit synchronizing clock signal; a Viterbi decoding circuit including a metric operation circuit for Viterbi-decoding the output of the a/d converting circuit in response to the bit synchronizing clock signal to output a bit stream, the metric operation circuit generating a metric operation result from an output of the a/d-converting circuit and prediction data, the Viterbi decoding circuit Viterbi-decoding the output of the a/d converting circuit with the metric operation result; an operating circuit for operating an equalizing error from the output of a/d converting circuit and a waveform equalizing target value; a coefficient generation circuit for generating the tap coefficient from the equalizing error to minimize the equalizing error; and a circuit for operating the prediction data from the output of the a/d converting circuit.

According to the present invention, a second decoding apparatus for decoding a signal reproduced from an optical disc is provided which includes: an automatic gain control circuit for controlling an envelope level of a waveform of the signal to a predetermined level; a waveform equalizing circuit having a frequency characteristic for waveform-equalizing the signal from the automatic gain control circuit to remove reproduction waveform distortion of the signal, the frequency characteristic being changed in accordance with at least a tap coefficient; an a/d converting circuit for a/d-converting an output of the waveform equalizing circuit in response to a sampling clock signal; a bit clock operation and data estimating circuit responsive to said sampling clock signal for operating a bit synchronizing clock position from an output of the a/d converting circuit to generate a bit synchronizing clock signal and estimating a level of an output of the a/d converting circuit at the bit synchronizing clock position to output estimated data; a Viterbi decoding circuit including metric operation circuit for Viterbi-decoding the output of the a/d converting circuit in response to the bit synchronizing clock signal to output a bit stream, the metric operation circuit generating a metric operation result from an output of the a/d-converting circuit and prediction data, the Viterbi decoding circuit Viterbi-decoding the output of the a/d converting circuit with the metric operation result; an operating circuit for operating an equalizing error from the output of the a/d converting circuit and a waveform equalizing target value; a coefficient generation circuit for generating the tap coefficient from the equalizing error to minimize the equalizing error; and a circuit for operating the prediction data from the output of the a/d converting circuit.

BRIEF DESCRIPTION OF THE DRAWINGS

The object and features of the present invention will become more readily apparent from the following detailed description taken in conjunction with the accompanying drawings in which:

FIG. 4 is a graphical drawing of the first embodiment showing target values of waveform equalizing;

FIG. 5A is an illustration of this embodiment showing condition transition of the Viterbi decoder shown in FIG. 1;

FIG. 5B is a table of this embodiment showing a relation between the condition transition shown in FIG. 5A and data;

The same or corresponding elements or parts are designated with like references throughout the drawings.

DETAILED DESCRIPTION OF THE INVENTION

<First Embodiment>

Figure 1:
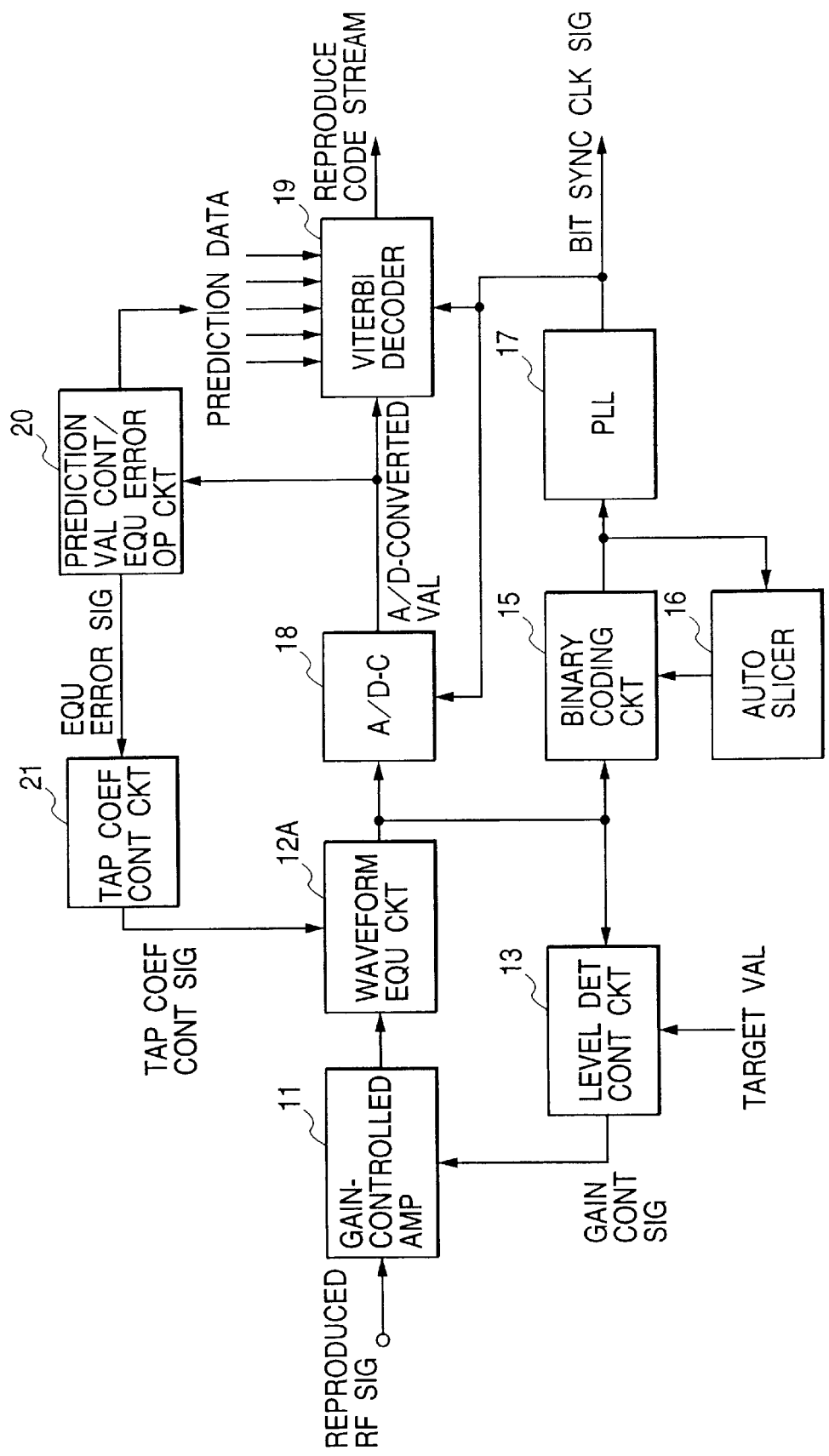
FIG. 1 is a block diagram of a decoding apparatus according to a first embodiment of this invention.

FIG. 1 is a block diagram of a decoding apparatus according to a first embodiment of this invention.

An RF (radio wave frequency) signal reproduced from an optical disc is supplied to a gain-controlled amplifier 11. The gain-controlled amplifier 11 amplifies the RF signal with envelope level kept constant in accordance with a gain control signal. An output of the gain-controlled amplifier 11 is supplied to a waveform equalizing circuit 12A. The waveform equalizing circuit 12A removes a waveform distortion caused by lack of transmission bandwidth, that is, the waveform equalizing circuit 12A waveform-shapes the output of the gain-controlled amplifier 11 with its frequency characteristic controlled. An output of the waveform equalizing circuit 12A is supplied to a level detection and controlling circuit 13, an a/d converter 18, and a binary coding circuit 15. The level detection and controlling circuit 13 compares an envelope level of an output of the waveform equalizing circuit 12A with a target value and generates the gain control signal to make the envelop level equal to the target value to control the gain of the gain-controlled amplifier 11. The binary coding circuit 15 binary-codes the output of the waveform equalizing circuit 12A such that the output of the waveform equalizing circuit 12A is compared with a center level to output a reproduced code stream. The reproduced code stream is supplied to a PLL (Phase locked Loop) circuit 17 and to an automatic slicer 16.

The automatic slicer 16 generates a level adjusting signal from the reproduced code stream and supplies the level adjusting signal to the binary coding circuit 15 to adjust the center level for comparing to prevent binary-coding error caused by asymmetric waveforms which may be generated in accordance with a molding condition of the optical disc. The PLL circuit 17 generates a bit synchronizing signal from the reproduced code stream.

The a/d converter 18 a/d-converts the output of the waveform equalizing circuit 12A in response to the bit synchronizing clock signal as a sampling pulse. An output of the a/d converter 18 is supplied to a Viterbi decoder 19 and a prediction data (values) controlling and equalizing error operation circuit 20 which obtains an equalizing error between equalizing target data and the output of the a/d converter 18. The equalizing error signal is supplied to a tap coefficient controlling circuit 21 which generates a tap coefficient control signal in accordance with the equalizing error signal. The tap coefficient control signal is supplied to the waveform equalizing circuit 12A to control the frequency characteristic of the waveform equalizing circuit 12A.

The prediction data controlling and equalizing error operation circuit 20 further generates prediction data (values) for metric operation of the Viterbi decoder 19 from the equalizing error signal.

The Viterbi decoder 19 decodes the output of the a/d converter 18 with the prediction data through the metric operation to output a reproduced code stream.

The operation will be described more specifically.

Figure 2:
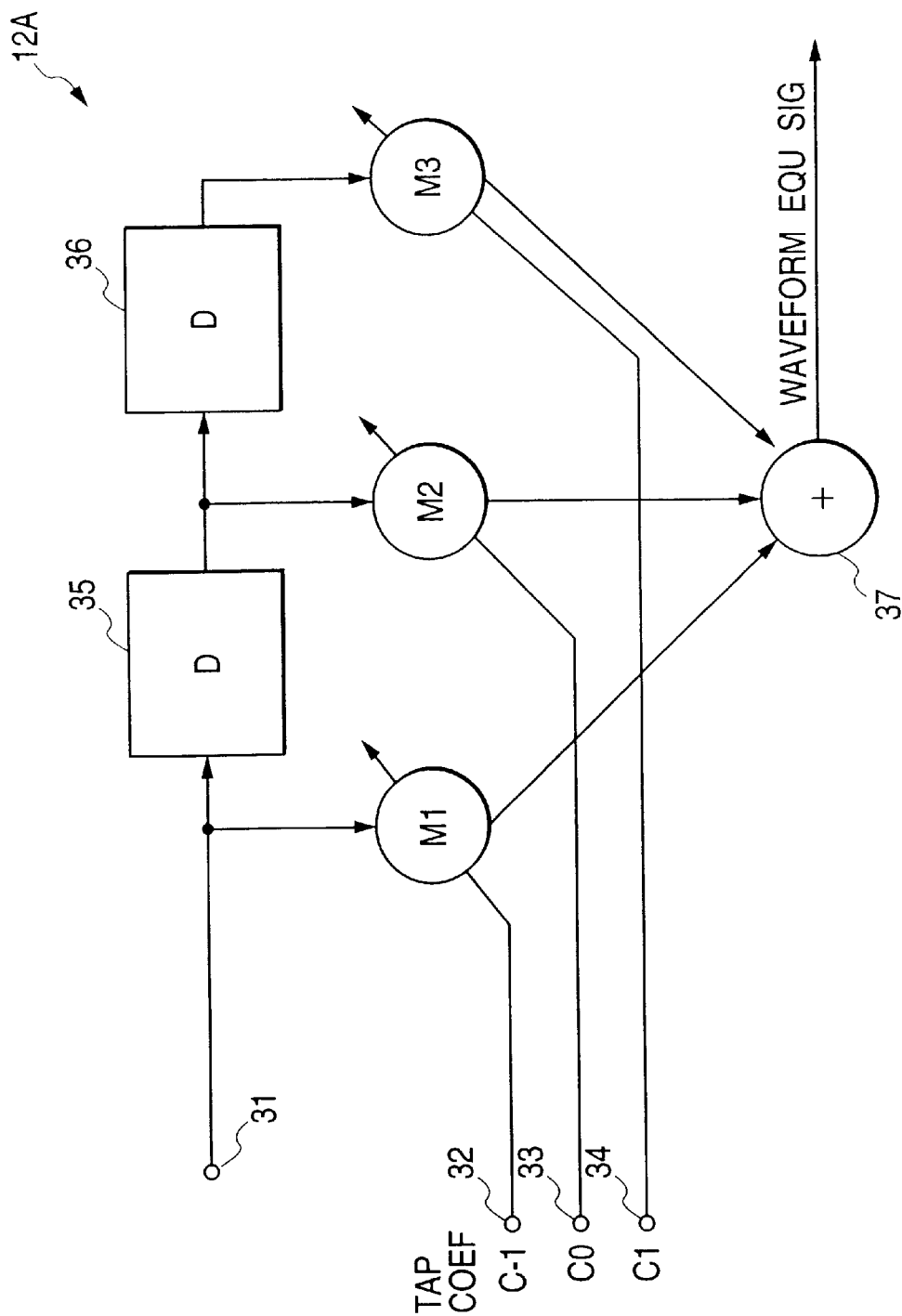
FIG. 2 is a block diagram of the waveform equalizing circuit shown in FIG. 1.

FIG. 2 is a block diagram of the waveform equalizing circuit 12A shown in FIG. 1. The waveform equalizing circuit 12A includes an input terminal 31 for inputting the output of the gain-controlled amplifier 11, tap coefficient control signal input terminals 32 to 34 for inputting tap coefficients C−1, C0, and C1, a delay 35 for delaying the output of the gain-controlled amplifier 11 by a predetermined interval, a delay 36 for delaying an output of the delay 35 by the predetermined interval, a multiplier M1 multiplies the output of the gain-controlled amplifier 11 by the tap coefficient C−1, a multiplier M2 multiplies the output of the delay 35 by the tap coefficient C0, a multiplier M3 multiplies the output of the delay 36 by the tap coefficient C1, and an adder 37 for adding the outputs of the multipliers M1, M2, and M3 to provide the output of the waveform equalizing circuit 12A. This structure controls the frequency characteristic of the waveform equalizing circuit 12A by controlling the tap coefficients C−1, C0, and C1 from the tap coefficient controlling circuit 21.

The prediction data controlling and equalizing error operation circuit 20 generates five prediction values (data) corresponding to converged levels of the sampled value of the a/d converter 18 on the basis of the output of the a/d converter 18 and operates the equalizing error in the waveform equalizing circuit 12A. The tap coefficient control circuit 21 adjusts the tap coefficients C–1, C0, and C1 such that the equalizing error is minimized or reduced.

In this embodiment, the number of the tap coefficients is three. However, this embodiment is applicable to a waveform equalizing supplied with more than three tap coefficients.

Figure 13:
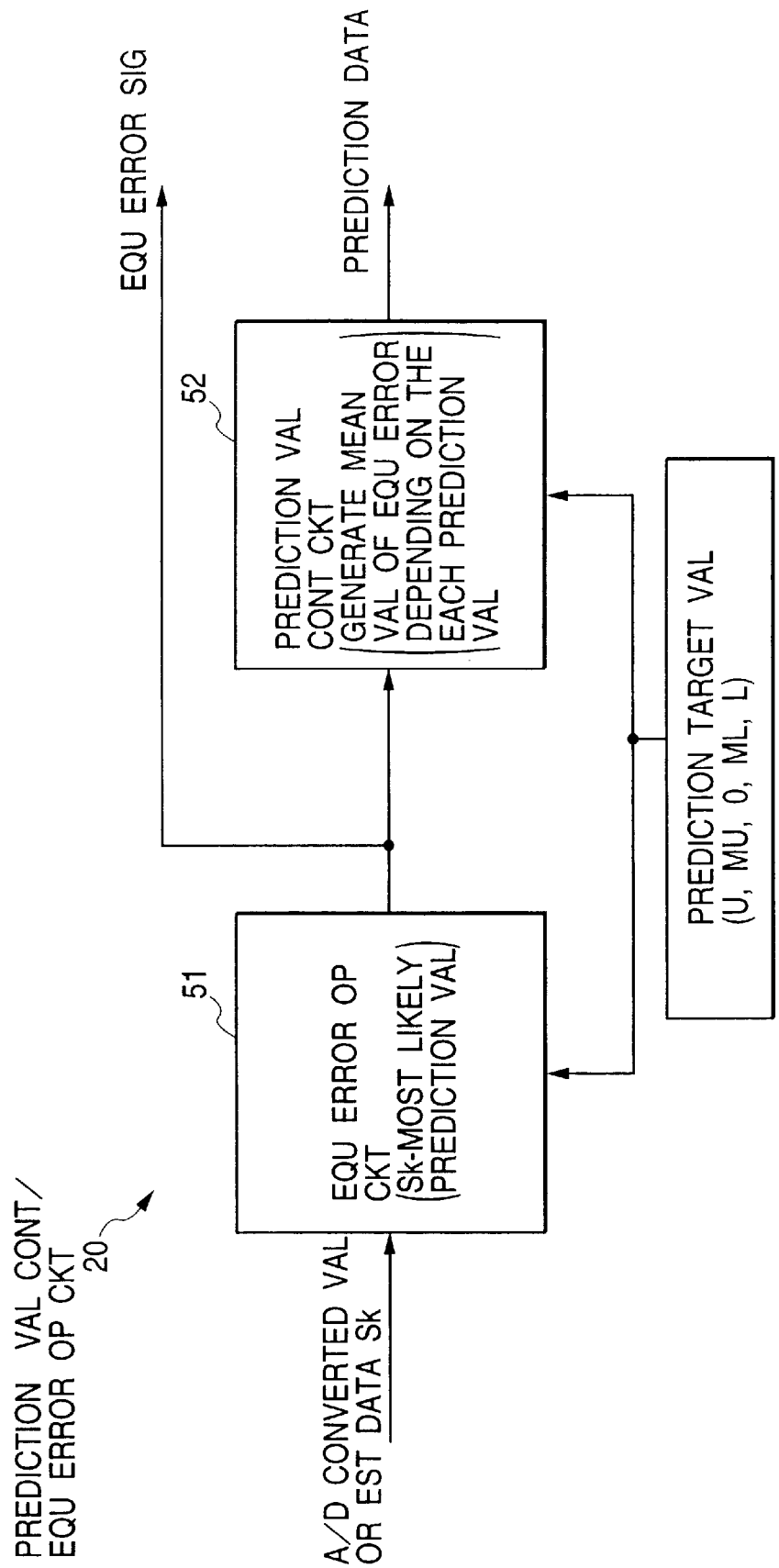
FIG. 13 is a block diagram of the prediction data controlling and equalizing error operation circuit shown in FIGS. 1 and 9.

FIG. 13 is a block diagram of the prediction data controlling and equalizing error operation circuit 20 shown in FIG. 1.

The prediction data controlling and equalizing error operation circuit 20 includes a equalizing error operation circuit 51 for operating the equalizing error signal in accordance with the a/d-converted value and prediction target values and a prediction value control circuit 52 for generating mean values of the equalizing error in accordance with each prediction target value to supply the prediction data to the Viterbi decoder 19.

Figure 3A:
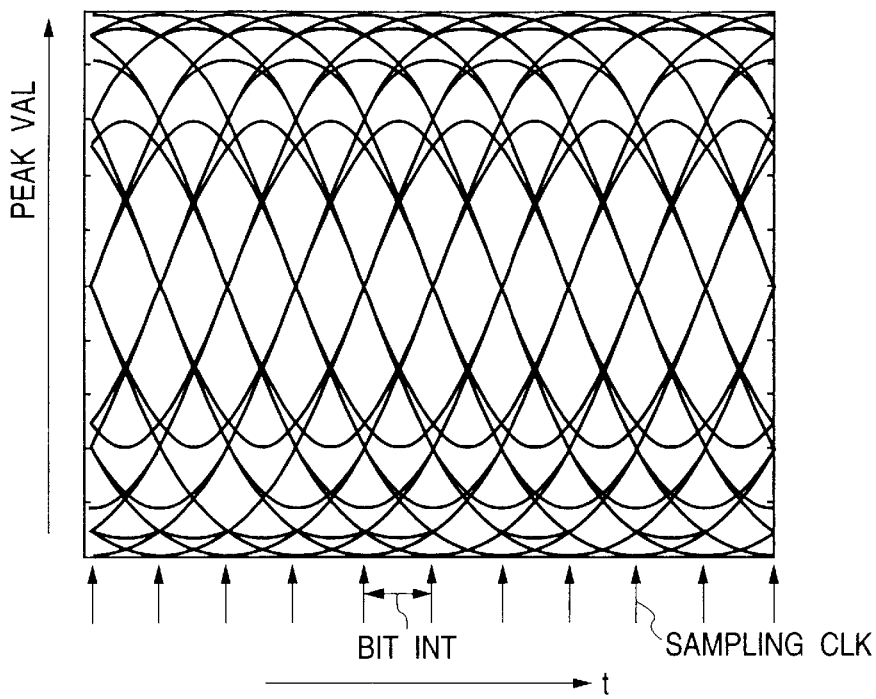
FIG. 3A is a graphical drawing of a prior art showing an eye pattern of a waveform equalizing circuit without adaptive waveform equalizing.
Figure 3B:
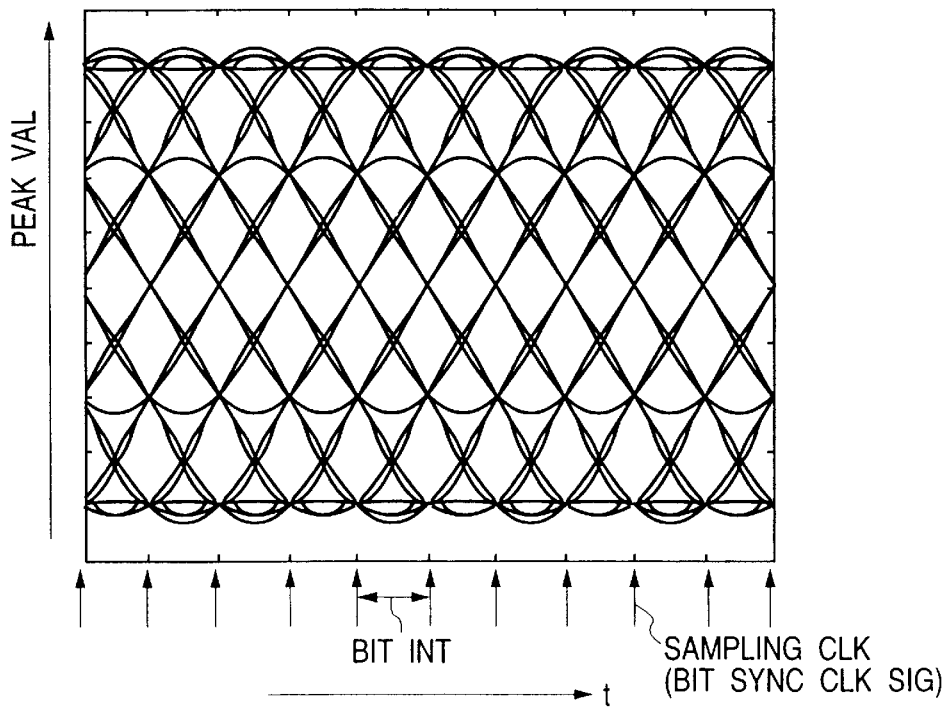
FIG. 3B is a graphical drawing of the first embodiment showing an eye pattern observed at the waveform equalizing circuit shown in FIG. 1.
Figure 6:
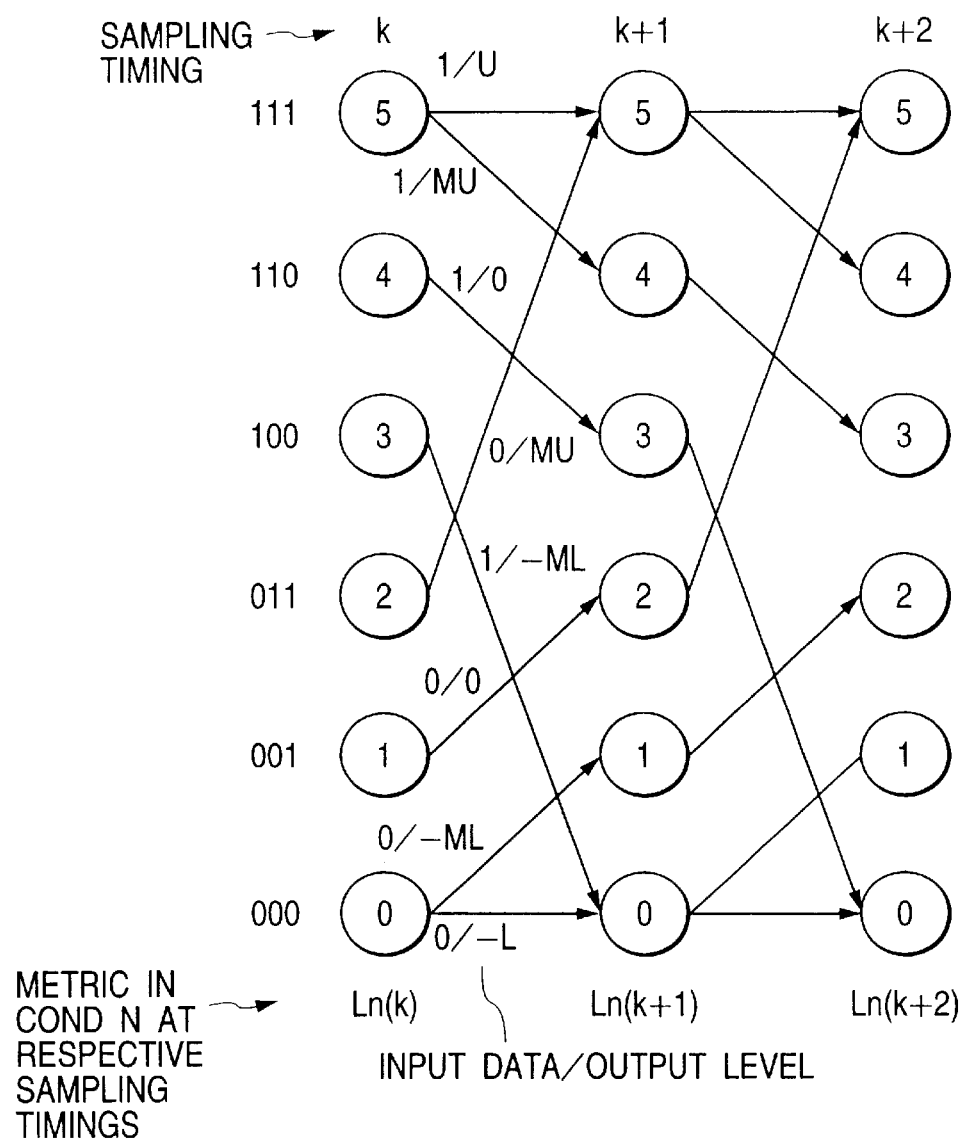
FIG. 6 is an illustration of the first embodiment showing a trellis diagram of the Viterbi decoder shown in FIG. 1.

FIG. 3A is a graphical drawing of a prior art showing an eye pattern of a waveform equalizing circuit without adaptive waveform equalizing. FIG. 3B is a graphical drawing of this embodiment showing an eye pattern observed at the waveform equalizing circuit 12A with adaptive waveform equalizing. FIG. 4 is a graphical drawing of this embodiment showing target values of waveform equalizing. FIG. 5A is an illustration of this embodiment showing condition transition of the Viterbi decoder shown in FIG. 1. FIG. 5B is a table of this embodiment showing a relation between the condition transition shown in FIG. 5A and data. FIG. 6 is an illustration of the first embodiment showing a trellis diagram of the Viterbi decoder 19.

If waveform equalizing is effected without adaptive waveform equalizing, the eye pattern is observed as shown in FIG. 3A. On the other hand, if ideal waveform equalizing is effected by the waveform equalizing circuit 12A with adaptive waveform equalizing according to this embodiment, the eye patten is observed as shown in FIG. 3B. This waveform is provided with waveform equalizing with a partial response characteristic (1,1,1,1), that is, waveform equalizing to have response of 1,1,1,1 at the bit synchronizing position in response to a single input pulse (isolated pulse). However, this embodiment is applicable to decoders using other partial response characteristics.

In FIGS. 3A and 3B, arrows show sampling points. The a/d converter 18 a/d-converts the output of the waveform equalizing circuit 12A at the sampling points in response to the bit synchronizing clock signal, so that the a/d-converted values can be represented with either of five values which is nearest to the input of the a/d converter 18. The prediction data controlling and equalizing error operation circuit 20 operates the equalizing error from the equalizing target values and the a/d-converted signal and generates five prediction values (data) corresponding the five values for the a/d converting from the obtained equalizing error and supplies the five prediction values to the Viterbi decoder 19. The target values U, ML, 0, –MU, and –L for the waveform equalizing are set as shown in FIG. 4. Moreover, the prediction data controlling and equalizing error operation circuit 20 supplies the equalizing error signal to the tap coefficient controlling circuit 21.

The condition transition in the Viterbi decoder 19 is shown in FIG. 5A and the relation between the condition transition and the data is shown in FIG. 5B. A trellis diagram of the Viterbi decoder 19 is shown in FIG. 6.

The equalizing error operation and the prediction value operation will be described more specifically.

The automatic gain control circuit including the gain-controlled amplifier 11 and the level detection and controlling circuit 13 keeps peak to peak values substantially constant. Therefore, if the symmetric characteristic and the waveform equalizing characteristic are ideal, the output of the a/d converter 18 converges on either of equalizing target values U, ML, 0, –MU, and –L.

The output of the a/d converter 18 is supplied to the prediction value controlling and equalizing error operation circuit 20 at every sampling to operate the equalizing error. It is assumed that the equation error at time k is ek. Then, ek is obtained from a difference between the sampled value and one of equalizing target values nearest to the sampled value. The tap coefficient control circuit 21 operates the tap coefficients C–1, C0, and C1 from the equalizing error ek at the time k. In this embodiment an example of operating by ZF (Zero-Forcing) algorithm is shown. That is, the tap coefficient operation in the tap coefficient control circuit 21 with the ZF algorithm is given by:

$$Cn[i+1]=Cn[i]-\alpha \times \Sigma \text{sgn}(S\hat{}(k-n) \times ek)$$

where Cn represents either of coefficients C–1, C0, and C1, i represents a coefficient renewing unit which is a predetermined interval defined by an operation clock signal, $\alpha$ is a renewing coefficient which is smaller than one, $\Sigma$ represents a total of the number of samples at the renewing unit timing, and S^(k-n) represents an equation target value. That is, the $(i+1)^{th}$ tap coefficient indicates that the $i^{th}$ tap is corrected with the second term of the above equation.

Moreover, the sgn function used in this equation is a signature function represented by:

$$\text{sgn}(x)=1(x>0, x=0)$$

$$\text{sgn}(x)=-1(x<0)$$

The tap coefficient control circuit 21 successively renews values of the tap coefficients C–1, C0, and C1 from the initial tap coefficient setting values in accordance with the equalizing error from the prediction value controlling and equalizing error operation circuit 20 with the above equation to supply the tap coefficient control signal to the waveform equalizing circuit 12A.

In this embodiment, the example of the operation according to the ZF algorithm. However, other known adaptive equalizing algorithms such as MSE (mean square error) algorithm are applicable.

Figure 7:
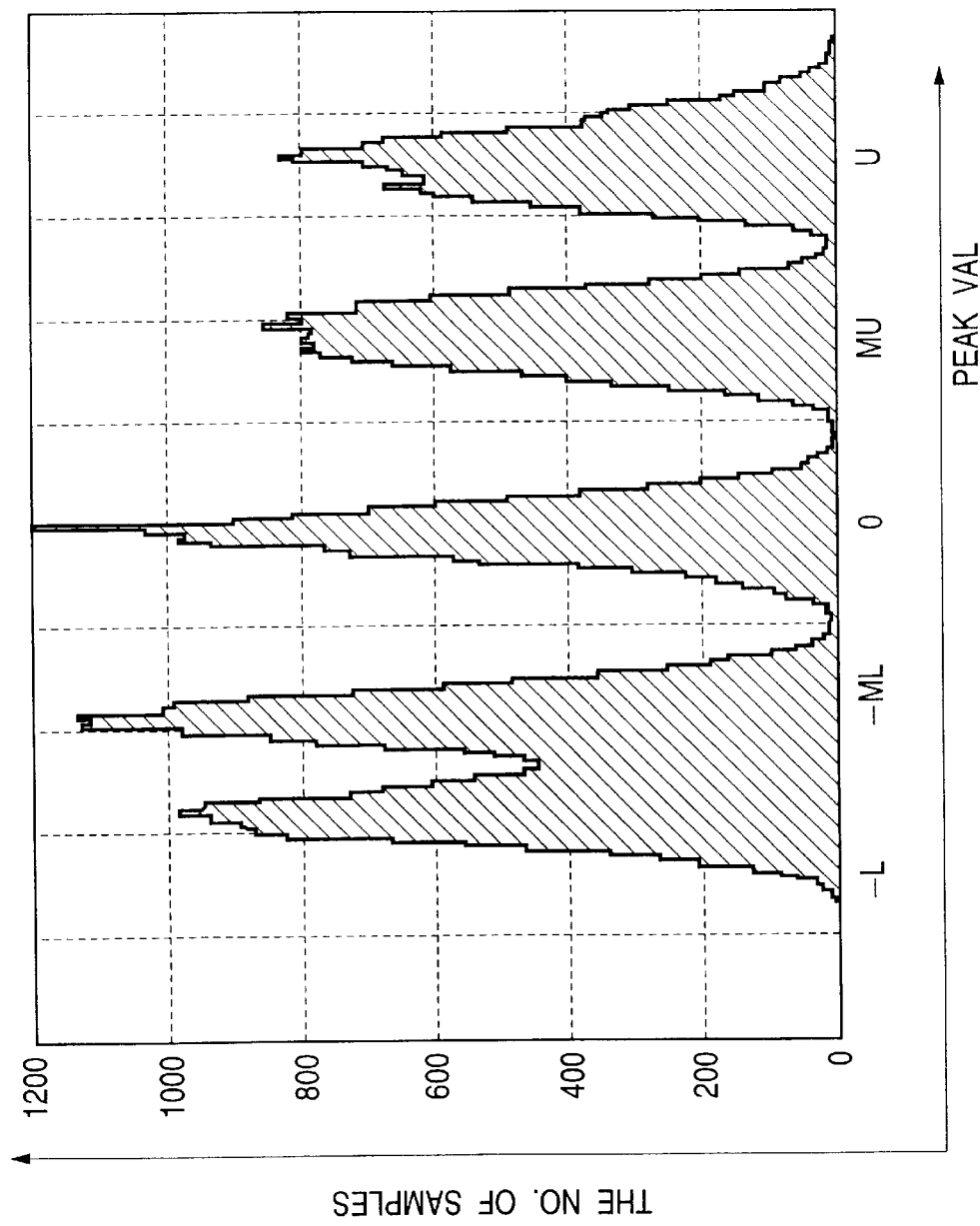
FIG. 7 is a graphical drawing of the first embodiment showing a histogram of a/d coding results.

FIG. 7 is a graphical drawing of this embodiment showing a histogram of a/d coding result.

When the signal to noise ratio is sufficient and symmetry of the reproduced signal is enough, there is a tendency that the sampled values converge on the equalizing target values U, MU, 0, –ML, and –L, so that it is sufficient that the equalizing target values can be used as the prediction values for the metric operation in the Viterbi decoder 19.

On the other hand, when the signal to noise ratio is insufficient and symmetry of the reproduced signal is not enough, it is insufficient that the equalizing target values are used as the prediction values for the metric operation in the Viterbi decoder 19 because a sufficient decoding characteristic cannot be obtained.

FIG. 7 shows such a condition. In this case, that is, when the symmetry is insufficient or waveform equalization is insufficiently effected, the prediction values for the metric operation is changed from the (prediction) target values U, MU, 0 −ML, and −L in accordance with the equalized waveforms (equalizing error) to improve the decoding characteristic of the Viterbi decoder 19.

The prediction data controlling and equalizing error operation circuit 20 generates the prediction values for the metric operation and supplies prediction values to the Viterbi decoder 19 as follows:

The prediction data controlling and equalizing error operation circuit 20 operates the equalizing error ek to a/d-converted values from the a/d converter 18 and obtains an average of the equalizing errors ek to the equalizing target values U, MU, 0, −ML, and −L. Moreover, the average of the equalizing error ek is obtained during obtaining the equalizing error and the prediction values are obtained by correcting the target values U, MU, 0, −ML, and −L.

The prediction data controlling and equalizing error operation circuit 20 and the tap coefficient control circuit 21 can be formed with discrete circuits such as multipliers and adders. However, it is also possible to form these circuits with microprocessors.

Figure 8:
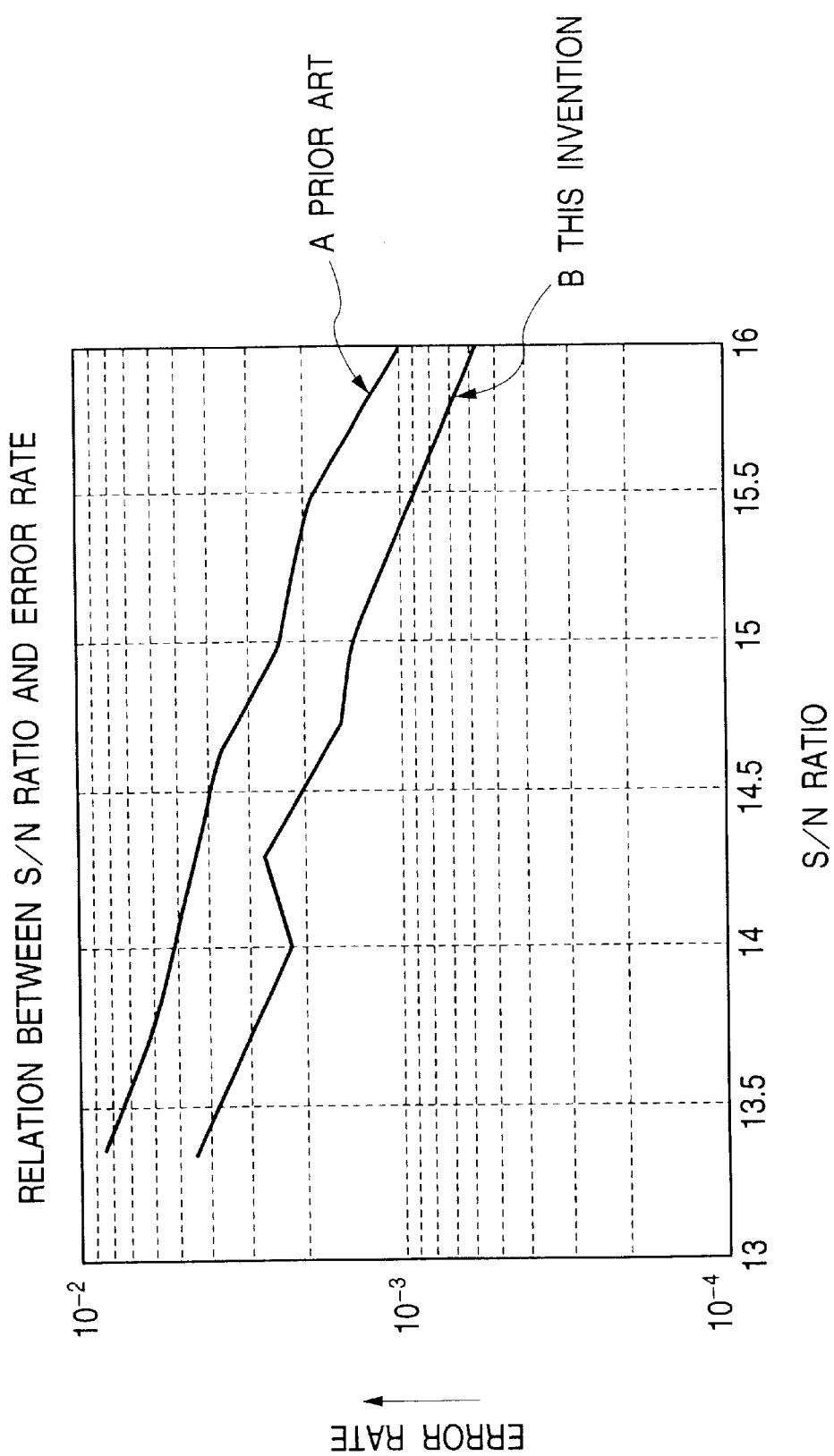
FIG. 8 is a graphical drawing of the first embodiment showing a relation between the signal to noise ratio and the error rate according to this embodiment.

FIG. 8 is a graphical drawing of this embodiment showing a relation between the signal to noise ratio and the error rate according to this embodiment, wherein a prior art relation is also shown for reference.

In FIG. 8, the characteristic curve A shows the prior art relation between the signal to noise ration and the error rate and the characteristic curve B shows a relation between the signal to noise ratio and the error rate according to this embodiment using five prediction values for the Viterbi decoding. As clearly understood from the characteristic curve B in FIG. 8, the decoding apparatus of the first embodiment improves the error rate to the signal to noise ratio.

<Second Embodiment>

Figure 9:
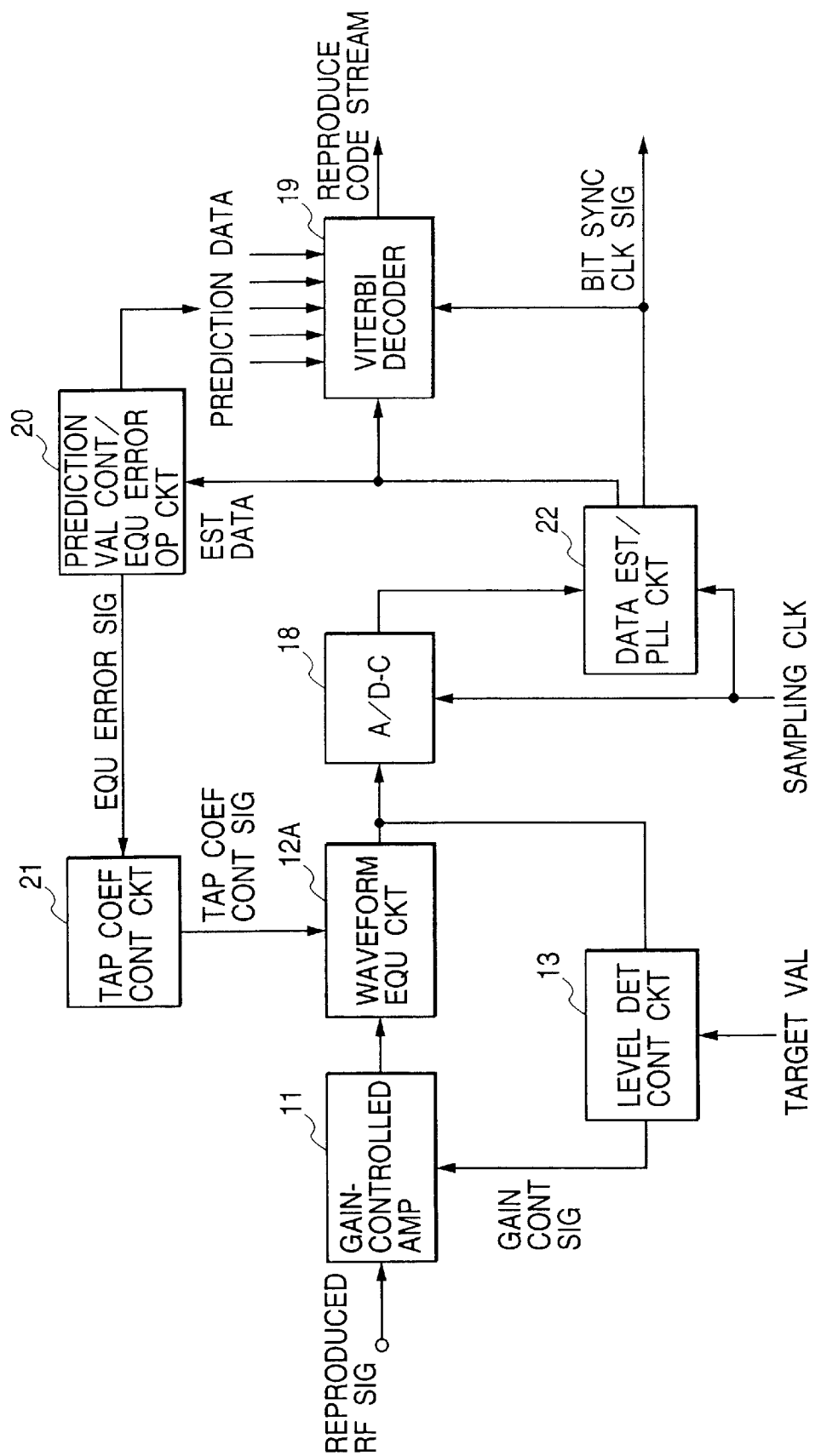
FIG. 9 is a block diagram of a decoding circuit of a second embodiment.

FIG. 9 is a block diagram of a decoding circuit of a second embodiment. The decoding circuit of the second embodiment is substantially the same as that of the first embodiment. The difference is that the binary coding circuit 15 and the automatic slicer 16 are omitted, the PLL circuit 17 is replaced with a data estimating PLL circuit 22 and the a/d-converter 18 is responsive to a sampling clock signal instead the bit synchronizing clock.

In this embodiment, the frequency of the sampling clock signal is slightly higher than that of the bit synchronizing signal. The a/d converter 18 converts the output of the waveform equalizing circuit 12A at the frequency sampling clock signal. The a/d converted signal is supplied to the data estimating PLL 22 which generates the bit synchronizing clock signals to supply it to the Viterbi decoder 19 and estimates the data at the timing of the bit synchronizing clock signal. The estimated data outputted from the data estimating PLL 22 is supplied to the prediction data controlling and equalizing error operation circuit 20 and the Viterbi decoder 19.

In this embodiment, the a/d-converting is performed after removing the waveform distortion by the waveform equalizing circuit 12A. However, it is also possible to a/d-convert the output of the gain-controlled amplifier 11 before the waveform equalizing circuit 12A.

Figure 10:
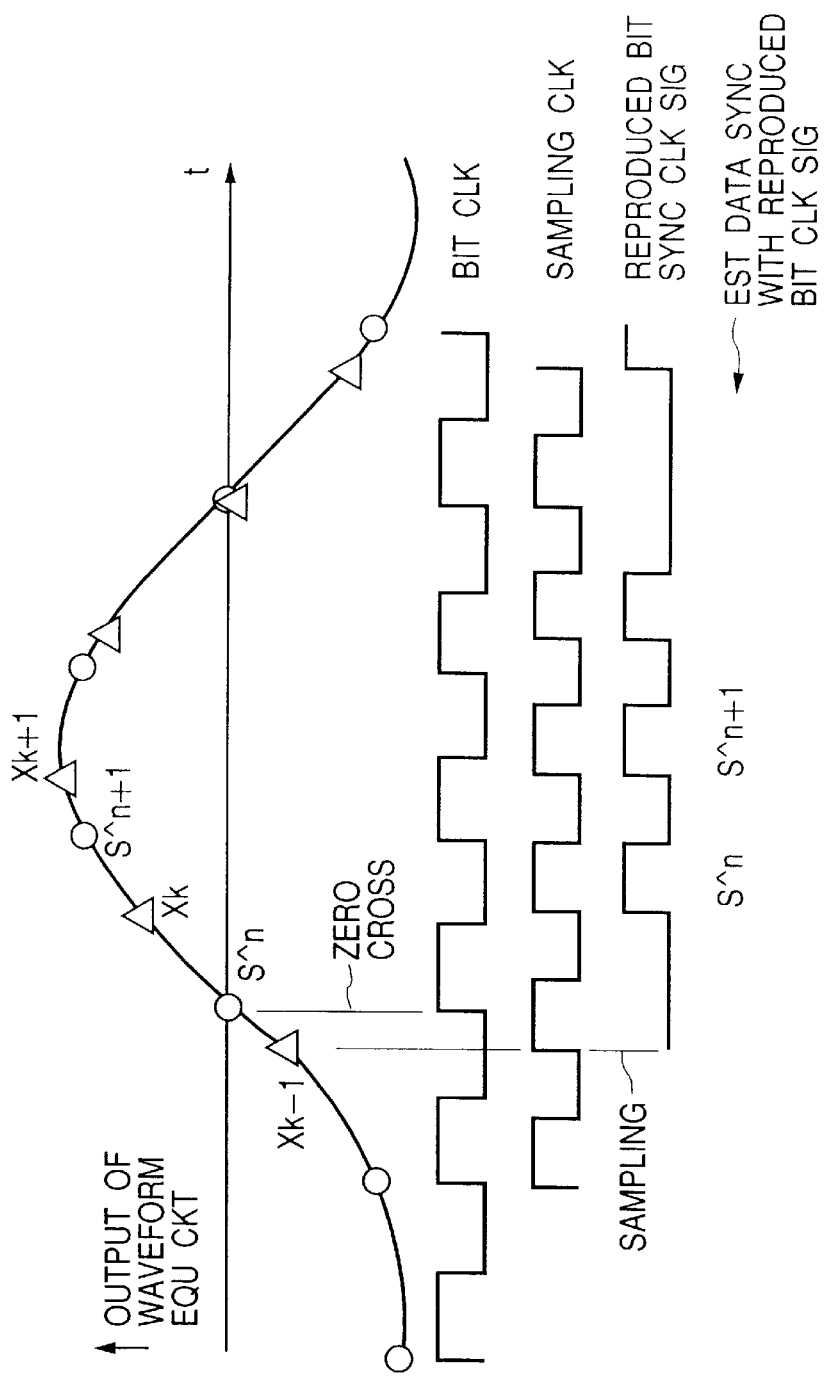
FIGS. 10A to 10E are time charts of the second embodiment illustrating the operation of the data estimating PLL circuit shown in FIG. 9.
Figure 11:
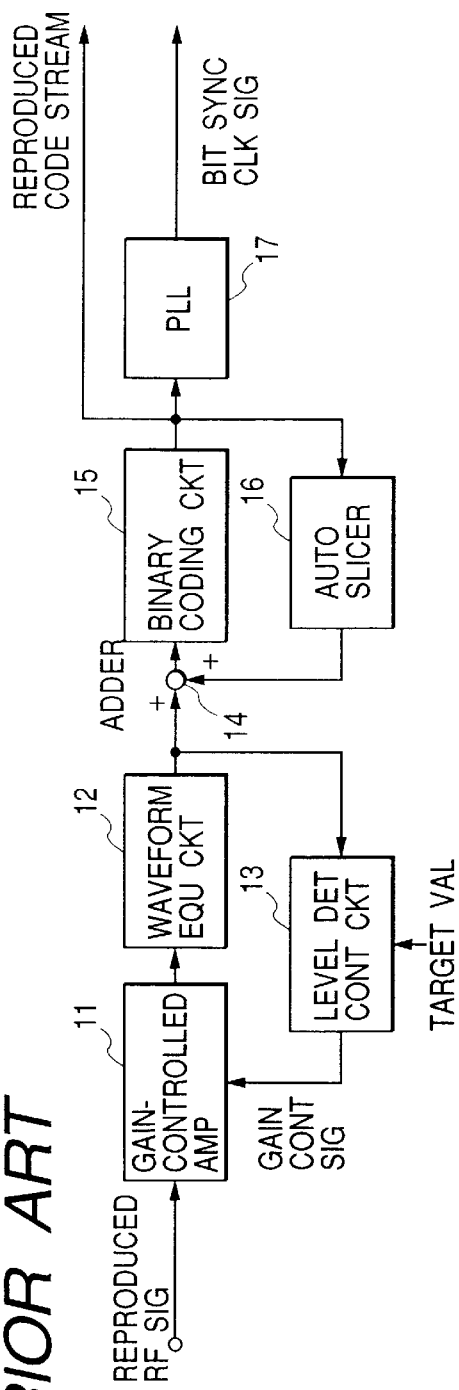
FIG. 11 is a block diagram of a prior art decoding apparatus for decoding a signal reproduced from an optical disc.
Figure 12:
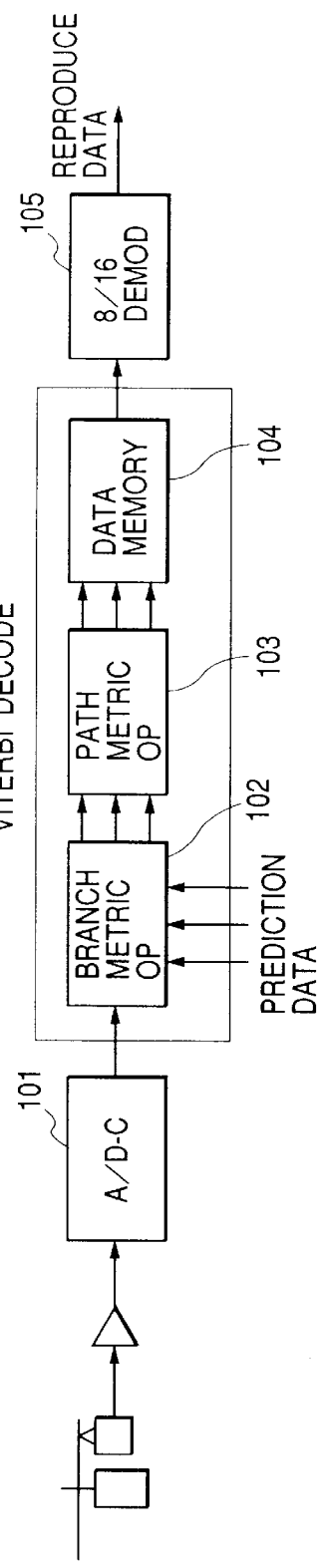
FIG. 12 is a block diagram of a prior art Viterbi decoder.

FIGS. 10A to 10E are time charts of the second embodiment illustrating the operation of the data estimating PLL circuit 22. The output of the waveform equalizing circuit 12A is a/d-converted at time k−1, k, and k+1 in response to the sampling clock signal as shown in FIGS. 10A and 10C. A zero-cross point is detected between the data streams Xk−1 and Xk. This point provides a phase point which corresponds to a rising edge of a bit clock shown in FIG. 10A. Using this phase point, the data estimating PLL circuit 22 provides PLL operation with a loop filter and a VCO (not shown) in the data estimating/PLL circuit 22. This PLL operation and a logic operation (not shown) generates a second bit synchronizing clock as shown in FIG. 10D.

In response to the bit synchronizing clock signal, the data estimating PLL circuit 22 estimates the data at the rising edge of the bit synchronizing clock signal.

The data is estimated by the linear interpolating or the convolution operation from the sampled data. More specifically, in FIG. 10A, data $S\hat{\,}n$ is obtained from data Xk−1 and data Xk and data $S\hat{\,}n+1$ is obtained from the data Xk and Xk+1 as shown in FIG. 10E.

With the estimated data from the data estimating PLL circuit 22 and the bit synchronizing clock, it is possible to generate the prediction values for the Viterbi decoder 19 and the tap coefficient signal for the waveform equalizing circuit 12A as similar to the first embodiment.

Moreover, if the a/d-converting is performed before the waveform equalizing circuit 12A, the similar operation is provided.

Figure 14:
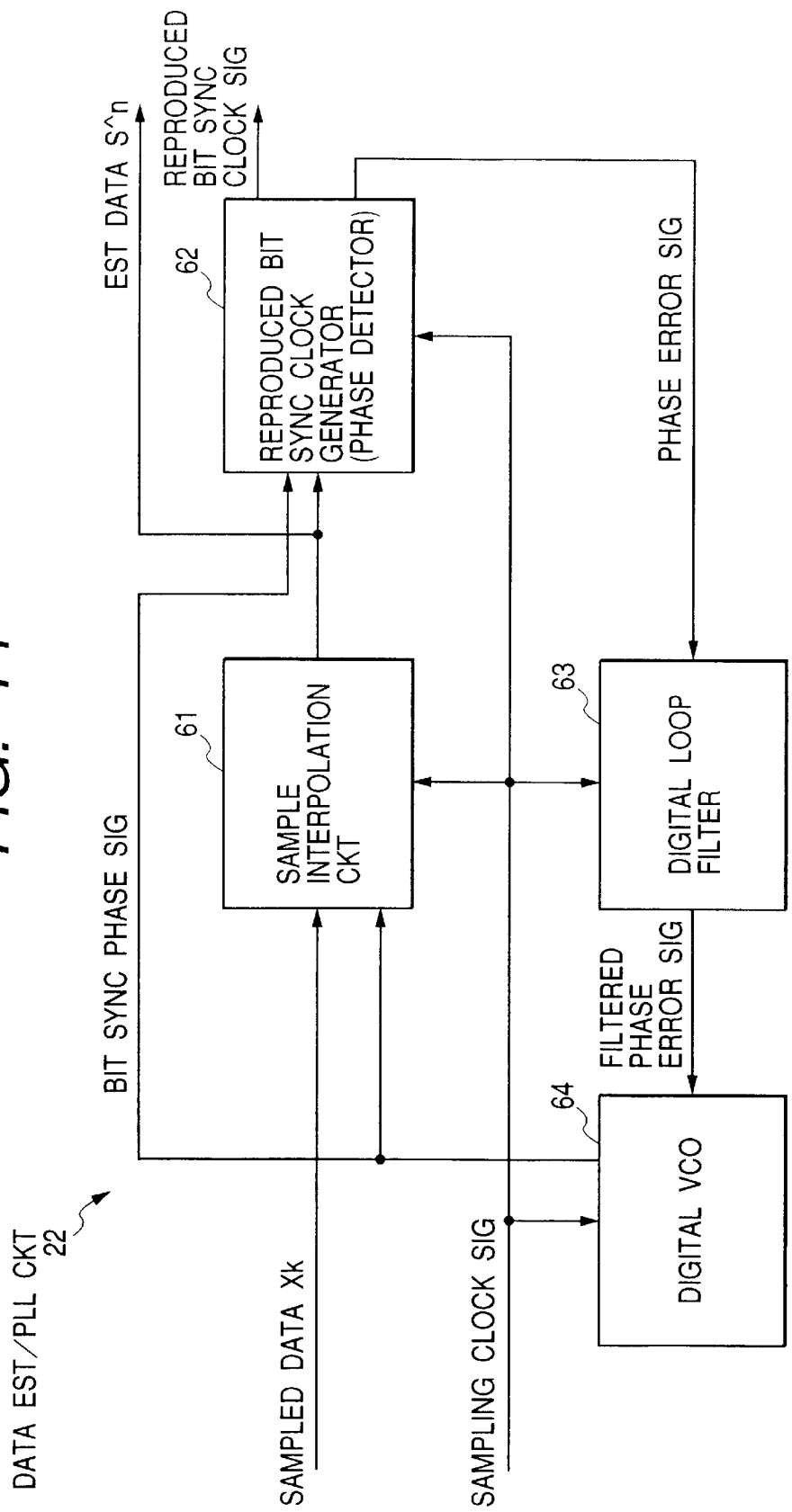
FIG. 14 is a block diagram of the data estimating PLL circuit according to the second embodiment.

FIG. 14 is a block diagram of the data estimating PLL circuit 22 according to the second embodiment.

The data estimating PLL circuit 22 includes a sample interpolation circuit 61 for interpolating the sampled data Xk in response to the sampling clock signal, a reproduced bit synchronizing clock generator (phase detector) 62 for generating the reproduced bit synchronizing-clock signal and a phase error signal, a digital loop filter 63 for filtering the phase error signal in response to the sampling clock signal, and a digital VCO 64 for generating the bit synchronizing phase signal in accordance with the filtered phase error signal in response to the sampling clock signal.

The data Xk sampled by the a/d converter 18 and the bit synchronizing phase signal (data point phase) are supplied to the sample interpolating circuit 61 which predicts the data value $S\hat{\,}k$ from the data Xk and the data point phase by linear interpolation or the convolution operation.

The reproduced bit synchronizing clock generator 62 generates the reproduced bit synchronizing clock signal and the phase error signal from the data point phase (bit synchronizing phase signal) and the sampling clock signal. Because the frequency of the sampling clock signal has higher than that of the bit synchronizing clock signal, the reproduced bit synchronizing clock signal is generated such that pulses of the sampling clock signal are thinned.

The phase detection can be detected because the zero level of the output of the waveform equalizing circuit (FIG. 10A) represents the data point phase. That is, as shown in FIG. 10A, the interpolation result $S\hat{\,}$ between the data Xk−1 and Xk is zero in the in-phase condition. However, if the interpolation result $S\hat{\,}$ is not zero, the value of the interpolation result $S\hat{\,}$ represents a phase error signal which is outputted by the reproduced bit synchronizing clock generator 62 and supplied to the digital VCO 64 via the digital loop filter 63. The digital VCO 64 generates the bit synchronizing phase signal with the data point phase compensated in accordance with the phase error signal to provide the PLL operation.

In the above-mentioned embodiments, the prediction data used for the metric operation in the Viterbi decoding is operated in accordance with distribution of sampled values of the equalized waveform to provide optimum values of the prediction data for the metric operation. Moreover, the equalizing error is operated from the equalized waveform and a target equalizing values to adaptively change the frequency characteristic of the waveform equalizing circuit to reduce the equalizing error.

What is claimed is:

1. A decoding apparatus for decoding a signal reproduced from an optical disc comprising:

automatic gain control means for controlling an envelope level of a waveform of said signal to a predetermined level;

waveform equalizing means having a frequency characteristic for waveform-equalizing said signal from said automatic gain control means to remove reproduction waveform distortion of said signal, said frequency characteristic being changed in accordance with at least a tap coefficient;

binary coding means for binary-coding an output of the waveform equalizing means;

a phase-locked-loop circuit for generating a bit synchronizing clock signal on the basis of an output of said binary coding means;

a/d converting means for a/d-converting an output of said waveform equalizing means in response to said bit synchronizing clock signal;

Viterbi decoding means including metric operation means for Viterbi-decoding said output of the a/d converting means in response to said bit synchronizing clock signal to output a bit stream, said metric operation means generating a metric operation result from an output of the a/d-converting means and prediction data, said Viterbi decoding means Viterbi-decoding said output of said a/d converting means with said metric operation result;

error operating means for outputting an equalizing error from the output of said a/d converting means and waveform equalizing target data;

coefficient generation means for generating said tap coefficient from said equalizing error to minimize the equalizing error; and data predicting means for generating said prediction data in accordance with said output of said a/d converting means.

2. A decoding apparatus for decoding a signal reproduced from an optical disc comprising:

automatic gain control means for controlling an envelope level of a waveform of said signal to a predetermined level;

waveform equalizing means having a frequency characteristic for waveform-equalizing said signal from said automatic gain control means to remove reproduction waveform distortion of said signal, said frequency characteristic being changed in accordance with at least a tap coefficient;

a/d converting means for a/d-converting an output of said waveform equalizing means in response to a sampling clock signal;

bit clock operation and data estimating means responsive to said sampling clock signal for operating a bit synchronizing clock position from an output of said a/d converting means to generate a bit synchronizing clock signal and estimating a level of an output of said a/d converting means at said bit synchronizing clock position to output estimated data;

Viterbi decoding means including metric operation means for Viterbi-decoding said output of said a/d converting means in response to said bit synchronizing clock signal to output a bit stream, said metric operation means generating a metric operation result from an output of said a/d-converting means and prediction data, said Viterbi decoding means Viterbi-decoding said output of said a/d converting means with said metric operation result;

error operating means for outputting an equalizing error from said output of said a/d converting means and a waveform equalizing target value;

coefficient generation means for generating said tap coefficient from said equalizing error to minimize the equalizing error; and data predicting means for generating said prediction data in accordance with said output of said a/d converting means.

* * * * *